(12) United States Patent
Matsuda et al.

(10) Patent No.: US 10,511,751 B2
(45) Date of Patent: Dec. 17, 2019

(54) PHOTOELECTRIC CONVERSION APPARATUS AND IMAGE PICKUP SYSTEM

(71) Applicant: CANON KABUSHIKI KAISHA, Tokyo (JP)

(72) Inventors: Takashi Matsuda, Yokohama (JP); Sho Suzuki, Yokohama (JP); Hidekazu Takahashi, Zama (JP); Nobuhiko Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/844,157

(22) Filed: Dec. 15, 2017

(65) Prior Publication Data

US 2018/0109706 A1 Apr. 19, 2018

Related U.S. Application Data

(63) Continuation of application No. 14/811,670, filed on Jul. 28, 2015, now Pat. No. 9,888,156.

(30) Foreign Application Priority Data

Jul. 31, 2014 (JP) .................................. 2014-156786

(51) Int. Cl.
*H04N 5/225* (2006.01)
*H01L 27/146* (2006.01)

(52) U.S. Cl.
CPC ....... *H04N 5/2253* (2013.01); *H01L 27/1461* (2013.01); *H01L 27/14612* (2013.01);
(Continued)

(58) Field of Classification Search
CPC ............ H04N 5/2253; H01L 27/14694; H01L 27/14621; H01L 27/14629;
(Continued)

(56) References Cited

U.S. PATENT DOCUMENTS

2006/0118795 A1* 6/2006 Araki ................ H01L 27/14634 257/83
2008/0224136 A1* 9/2008 Wang .................. H01L 27/1463 257/53

(Continued)

FOREIGN PATENT DOCUMENTS

JP S57-173969 A 10/1982
JP S60-093893 A 5/1985
(Continued)

*Primary Examiner* — Jason A Flohre
(74) *Attorney, Agent, or Firm* — Canon U.S.A., Inc. I.P. Division

(57) ABSTRACT

A photoelectric conversion apparatus includes a photoelectric conversion unit having a light incident surface and including: a first electrode; a second electrode disposed further toward the light incident surface; and a photoelectric conversion layer disposed between the first and second electrodes. The photoelectric conversion apparatus includes a member in contact with the photoelectric conversion layer and constituting a light guide together with the layer. An area of a first surface parallel to the light incident surface at a portion of the photoelectric conversion layer surrounded by the member is smaller than an area of a second surface disposed between the first surface and the second electrode at a portion of the photoelectric conversion layer surrounded by the member, and an area of orthogonal projection to the light incident surface of the first electrode is smaller than an area of orthogonal projection to the light incident surface of the second surface.

33 Claims, 7 Drawing Sheets

(52) U.S. Cl.
CPC .. *H01L 27/14621* (2013.01); *H01L 27/14623* (2013.01); *H01L 27/14627* (2013.01); *H01L 27/14629* (2013.01); *H01L 27/14645* (2013.01); *H01L 27/14665* (2013.01); *H01L 27/14694* (2013.01)

(58) Field of Classification Search
CPC ......... H01L 27/14627; H01L 27/14665; H01L 27/14612; H01L 27/14623; H01L 27/1461; H01L 27/14645
See application file for complete search history.

(56) References Cited

U.S. PATENT DOCUMENTS

| | | | | |
|---|---|---|---|---|
| 2010/0102303 | A1* | 4/2010 | Nomura | C07D 277/30 257/40 |
| 2010/0187501 | A1* | 7/2010 | Toda | H01L 27/14632 257/21 |
| 2011/0156104 | A1* | 6/2011 | Yamaguchi | H01L 27/14603 257/222 |
| 2012/0286137 | A1* | 11/2012 | Yamaguchi | H01L 27/14607 250/208.1 |
| 2013/0001730 | A1* | 1/2013 | Miyanami | H01L 27/14603 257/443 |
| 2013/0062593 | A1 | 3/2013 | Jones | |
| 2014/0035082 | A1* | 2/2014 | Chu | H01L 27/1463 257/432 |
| 2014/0077324 | A1* | 3/2014 | Matsugai | H01L 27/14618 257/432 |
| 2014/0231781 | A1* | 8/2014 | Imai | H01L 51/448 257/40 |
| 2015/0187843 | A1* | 7/2015 | Hatano | H01L 27/1464 257/40 |

FOREIGN PATENT DOCUMENTS

| | | |
|---|---|---|
| JP | H01-201953 A | 8/1989 |
| JP | H09-275201 A | 10/1997 |
| JP | 2002-530897 A | 9/2002 |
| JP | 2011-243704 A | 12/2011 |
| JP | 2012-039004 A | 2/2012 |
| JP | 2012-234949 A | 11/2012 |
| JP | 2014-127545 A | 7/2014 |

* cited by examiner

PHOTOELECTRIC CONVERSION APPARATUS AND IMAGE PICKUP SYSTEM

CROSS REFERENCE TO RELATED APPLICATIONS

The present application is a continuation of U.S. patent application Ser. No. 14/811,670, filed on Jul. 28, 2015, which claims priority from Japanese Patent Application No. 2014-156786 filed Jul. 31, 2014, which is hereby incorporated by reference herein in its entirety.

BACKGROUND OF THE INVENTION

Field of the Invention

The present invention relates to a photoelectric conversion apparatus and an image pickup system using a photoelectric conversion apparatus.

Description of the Related Art

A photoelectric conversion apparatus using a photoelectric conversion layer provided on a semiconductor substrate has been proposed. Japanese Patent Laid-Open No. 2012-064822 describes a photoelectric conversion apparatus that includes a photoelectric conversion layer provided for each pixel and disposed between an upper electrode and a lower electrode. The upper electrode and the photoelectric conversion layer described in Japanese Patent Laid-Open No. 2012-064822 extend to reach a pixel boundary portion and, therefore, a photoelectric convertible area has a high area occupancy in a single pixel (i.e., an aperture ratio is high). The lower electrode described in Japanese Patent Laid-Open No. 2012-064822 is provided to extend from the pixel boundary portion to the pixel boundary portion in the same manner as the upper electrode and the photoelectric conversion layer. Since the lower electrode constitutes a part of capacitance of the photoelectric conversion layer, the capacitance of the photoelectric conversion layer varies in accordance with the shape of the lower electrode. In the photoelectric conversion apparatus, in the case where capacitance for accumulation of charge in the photoelectric conversion layer is increased, noise (kTC noise) superimposed on photoelectrically converted signals may increase. The present invention reduces noise in the signals generated in the photoelectric conversion layer while maintaining the aperture ratio of the photoelectric conversion layer.

SUMMARY OF THE INVENTION

In an aspect of the present invention, a photoelectric conversion apparatus including a photoelectric conversion unit provided with a light incident surface, the photoelectric conversion unit including: a first electrode; a second electrode disposed further toward a light incident surface than the first electrode; and a photoelectric conversion layer disposed between the first electrode and the second electrode. The photoelectric conversion apparatus includes a member that is in contact with the photoelectric conversion layer and that constitutes a light guide together with the photoelectric conversion layer, an area of a first surface that is parallel to the light incident surface and is located in the photoelectric conversion layer surrounded by the member is smaller than an area of a second surface disposed between the first surface and the second electrode and is located in the photoelectric conversion layer surrounded by the member, and an area of orthogonal projection to the light incident surface of the first electrode is smaller than an area of orthogonal projection to the light incident surface of the second surface.

Further features of the present invention will become apparent from the following description of exemplary embodiments with reference to the attached drawings.

DESCRIPTION OF THE EMBODIMENTS

First Embodiment

A first embodiment is described with reference to FIGS. 1 and 2. Common or known techniques are applied to the portions that are not illustrated or described in the specification. For the ease of description, an area of each configuration may be described using a width in cross section of each configuration.

Figure 1:
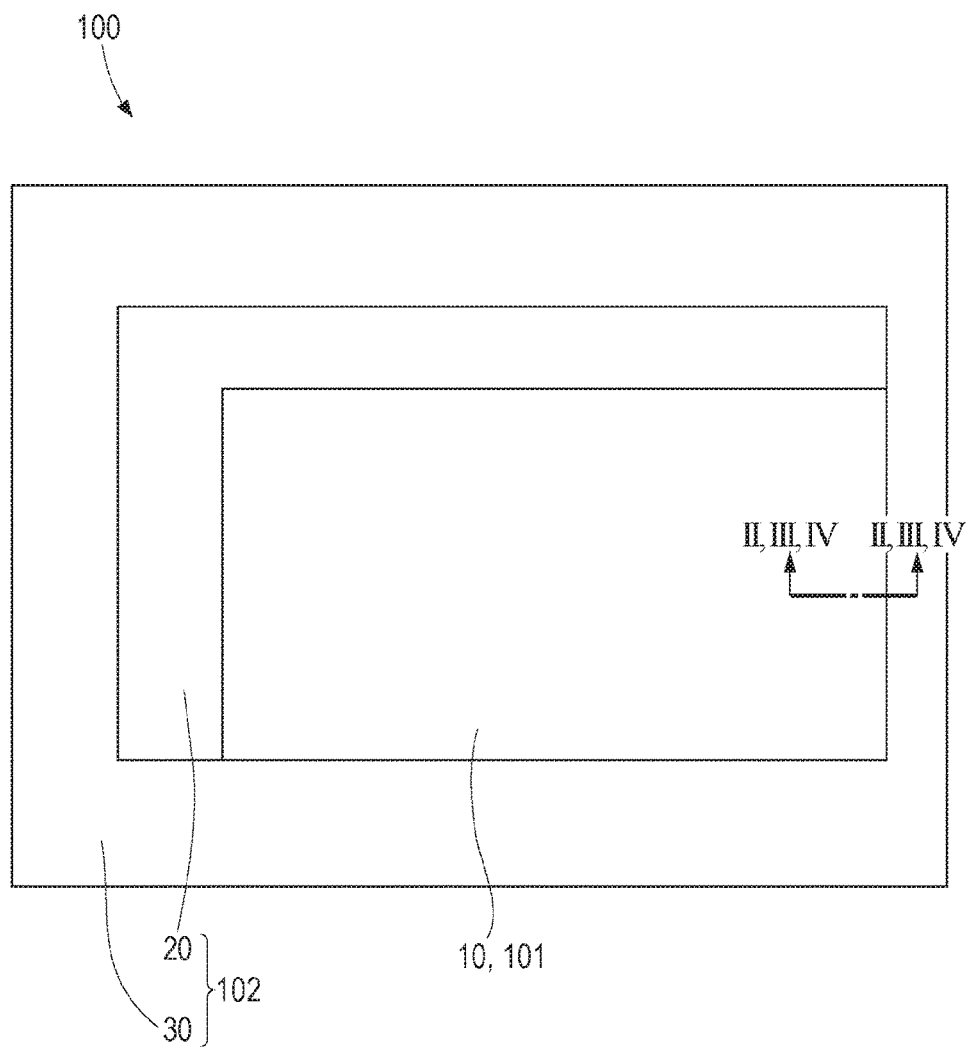
FIG. 1 is a schematic plan view illustrating a first embodiment.

FIG. 1 illustrates a schematic plan view of a photoelectric conversion apparatus 100. The photoelectric conversion apparatus 100 includes a region 101 including a light receiving region 10, and a region 102 including a light-shielded region 20 and a peripheral circuit region 30. The region 102 is provided outside the region 101. A plurality of pixels are arranged in two dimensional arrays in the light receiving region 10 and in the light-shielded region 20. Each of the pixels includes at least one photoelectric conversion unit and a readout circuit for reading signals produced in the photoelectric conversion unit. The readout circuit includes, for example, a transfer transistor electrically connected to the photoelectric conversion unit, an amplifying transistor having a gate electrode electrically connected to the photoelectric conversion unit, and a reset transistor for resetting the photoelectric conversion unit. The peripheral circuit region 30 is a region in which peripheral circuits that control an operation of the light receiving region 10 and process the signals read from the light receiving region 10 are disposed. The peripheral circuit region 30 includes, for example, processing circuits, such as an amplifier circuit, a horizontal scanning circuit, and a vertical scanning circuit. The light-shielded region 20 and the peripheral circuit region 30 are covered with a light-shielding film when seen from a direction vertical to a surface of a semiconductor substrate. The light receiving region 10 is a region where a light-shielding film is not provided or a light-shielding film opened at pixels is provided when seen from a direction vertical to a surface of a semiconductor substrate. Thus, light reaches the photoelectric conversion unit in the light receiving region 10. At least some of the pixels arranged in the light-shielded region 20 are optical black pixels (OPB pixels), and signals obtained by the OPB pixels are used as the black reference signal. That is, the regions 101 and 102 can be provided. The region 101 includes the light receiving region 10, and the region 102 includes the light-shielded region 20 and the peripheral circuit region 30. The region 102 is provided outside the region 101.

Figure 2:
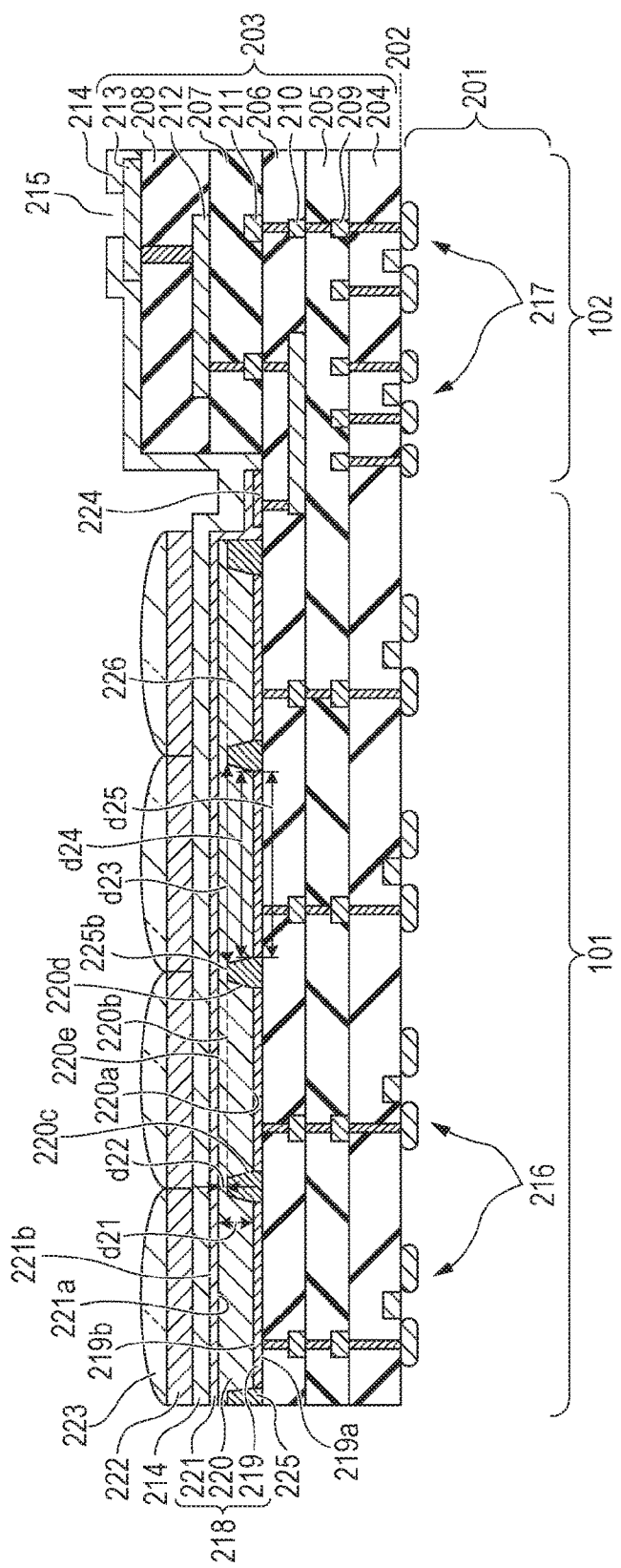
FIG. 2 is a schematic sectional view illustrating the first embodiment.

FIG. 2 is a cross sectional view along line II, III, IV-II, III, IV in the schematic plan view of FIG. 1. The line II, III, IV-II, III, IV extends across the regions 101 and 102. In the region 101, a plurality of photoelectric conversion units 218 are provided on a semiconductor substrate (hereafter, referred also to as a substrate) 201. Here, two photoelectric conversion units 218 are illustrated. Two photoelectric conversion units 218 are arranged in a direction parallel to a surface 202 of the substrate 201. Here, a direction vertical to the surface 202 and away from the surface 202 is defined as an upper direction, and a direction vertical to the surface 202 and approaching to the inside of the substrate 201 is defined as a lower direction. A distance in the upper direction can be defined also as a height when the surface 202 is made a reference.

The photoelectric conversion unit 218 includes an electrode 219, a photoelectric conversion layer 220, and an electrode 221, and has a light incident surface. The electrode 219 (a first electrode) is referred also to as a lower electrode, composed of an electric conductor made mainly from, for example, aluminum or copper. The electrode 219 has a lower surface 219a and an upper surface 219b. The electrode 221 (a second electrode) is referred also to as an upper electrode, which is located further toward the light incident surface than the electrode 219. The electrode 221 is desirably made from a transparent conductive material, e.g., an electric conductor composed mainly of, for example, indium tin oxide (ITO) or polyimide. The electrode 221 includes a lower surface 221a and an upper surface 221b. The electrode 221 is electrically connected to a wiring layer 210 via an electric conductor 224. The electric conductor 224 is made, for example, of the same material as that of the electrode 221. The photoelectric conversion layer 220 is made from a photoelectrically convertible material consisting of an inorganic material or an organic material. An inorganic material layer selected from, for example, an amorphous silicon layer, an amorphous selenium layer, a quantum dot layer, and a compound semiconductor layer may be used as the photoelectric conversion layer 220. An organic material selected from a dye, such as a metal complex dye and a cyanine dye may be used as the material for the photoelectric conversion layer 220. In addition, derivatives, such as acridine, coumarin, triphenylmethane, fullerene, aluminum quinoline, polyparaphenylene vinylene, polyfluorene, polyvinyl carbazole, polythiol, polypyrrole, and polythiophene may be used as the material for the photoelectric conversion layer 220. A quantum dot layer may be used as the photoelectric conversion layer 220. The quantum dot layer is composed, for example, of a buffer material of AlGaAs or GaAs and quantum dots of InAs or InGaAs. Here, the light incident surface of the photoelectric conversion unit 218 is, for example, the upper surface 221b of the electrode 221.

The photoelectric conversion apparatus includes a member 225 that constitutes a light guide together with the photoelectric conversion layer 220. The member 225 may be made from any material having a refractive index lower than that of the photoelectric conversion layer 220, and is made from silicon oxide in the present embodiment.

A shape of the light guide of the present embodiment is described. The light guide is provided at least between a surface including the upper surface 219b of the electrode 219 and a surface including the lower surface 221a of the electrode 221. The light guide guides light using reflection or refraction on an interface between the side surfaces 220c and 220d of the photoelectric conversion layer 220 and the member 225. In the present embodiment, the member 225 has an opening, in which the photoelectric conversion layer 220 is provided. The photoelectric conversion layer 220 includes a portion 226 surrounded by the member 225. The light incident surface of the photoelectric conversion unit 218 is the upper surface 221b of the electrode 221. An area of a surface (a first surface) of the portion 226 parallel to the light incident surface is smaller than an area of a surface (a second surface) of the portion 226 parallel to the light incident surface and disposed between the first surface and the electrode 221. An area of orthogonal projection to the light incident surface of the electrode 219 is smaller than an area of orthogonal projection to the light incident surface of the second surface. That is, the aperture ratio is maintainable because the area of the photoelectric conversion layer 220 on the side of the light incidence is larger than the area of the photoelectric conversion layer 220 on the side of the electrode 219. Since the parasitic capacitance produced in a node of the electrode 219 can be reduced because of the area of the electrode 219 being small, the noise (kTC noise) can be reduced. Therefore, it is possible to reduce the noise while maintaining the aperture ratio. Here, the kTC noise is obtained by $Q=(kTC)^{0.5}$ when the charge number that becomes noise is denoted by Q (k: constant, T: temperature, C: capacitance of photoelectric conversion layer).

In the present embodiment, an area of a set first surface corresponds, for example, to an area of the lower surface 220a of the portion 226, and an area of a set second surface corresponds, for example, to an area of the upper surface 220b of the portion 226. Here, the area of orthogonal projection to the light incident surface of the electrode 219 coincides with the area of the lower surface 219a. As illustrated in FIG. 2, the upper surface 220b has a width of a length d23, the lower surface 220a has a width of a length d24, and the lower surface 219a has a width of a length d25. The relationship among these lengths is length d23>length d24 and length d23>length d25. Here, the width corresponds to, for example, the length of the member or the opening along the direction horizontal to the surface 202 of the substrate 201. In subsequent description, when describing the width, each configuration has the same planar structure as that illustrated in FIG. 7A. Here, the width of the area of each surface of the member and the width of the electrode are the maximum length.

Figure 7A:
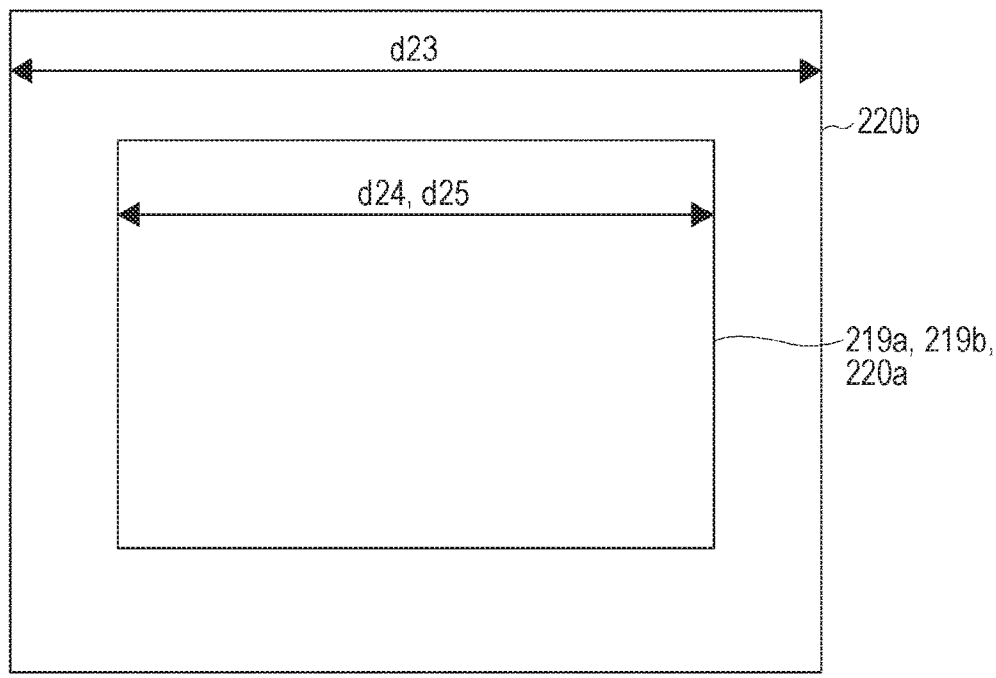
FIGS. 7A and 7B are schematic plan views illustrating the first embodiment.
Figure 7B:
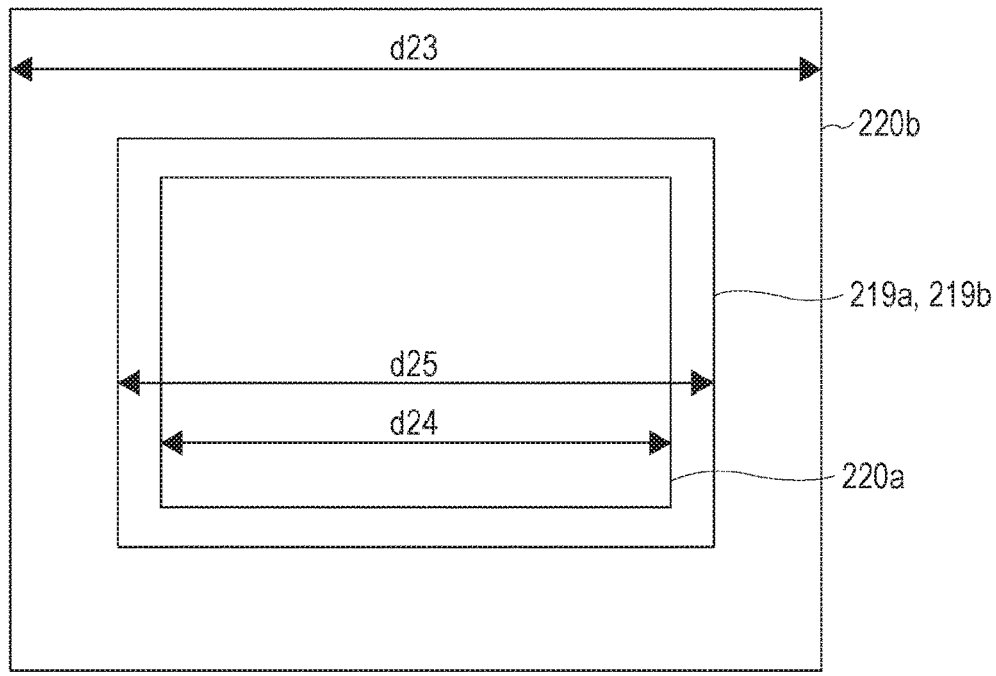

The relationship among the surfaces seen in plan view is illustrated in FIG. 7A. FIG. 7A is a schematic diagram in which outer edges of arbitrary structures are projected to the light incident surface. A projection image of each configuration is referred also to as orthogonal projection. The upper surface 220b has the largest outer edge, and the lower surface 220a and the lower surface 219a are located inside the outer edge of the upper surface 220b. In the present embodiment, the lower surface 220a and the lower surface 219a have the same area, and the upper surface 219b of the electrode 219 also has the same area. Areas of the lower surface 220a of the photoelectric conversion layer 220, the upper surface 219b of the electrode 219, and the lower surface 219a of the electrode 219 may be different from each other, but it is desirable that the area of the lower surface 220a is equal to or smaller than the area of the upper surface 219b of the electrode 219. That is, as illustrated in FIG. 7B, it is desirable that an outer edge of the lower surface 220a is located inside the outer edge of the upper surface 219a of the electrode 219. With this configuration, signals generated in the photoelectric conversion layer can be electrically collected efficiently. If the area of the lower surface 220a is smaller than the area of the upper surface 219b of the electrode 219, the electrode 219 can function as an etching stop during the formation of the opening and, therefore, a photoelectric conversion apparatus with less damage can be provided.

Hereinafter, other configurations illustrated in FIG. 2 are described briefly. A plurality of transistors 216 are arranged on the substrate 201 in the region 101. A plurality of transistors 217 are arranged on the substrate 201 in the region 102. The plurality of transistors 217 constitute the above-described readout circuit and peripheral circuits. A wiring structure 203 is provided on the surface 202 of the substrate 201. The wiring structure 203 includes insulating layers 204 to 206 provided across the regions 101 and 102, and insulating layers 207 and 208 provided in the region 102. The wiring structure 203 includes wiring layers 209 and 210 provided in both the regions 101 and 102, and wiring layers 211, 212, and 213 provided in the region 102 and not provided in the region 101. The wiring layers are located in mutually different heights, and have various circuit patterns. The wiring layer 212 functions as a light-shielding film for reducing light incident on the substrate 201 in, for example, at least a part of the region 102. The wiring layer 213 functions as a terminal (a pad portion) for connection with the outside. The protective layer 214 covers the wiring layer 213 from above the photoelectric conversion unit 218 in the region 101, and includes an opening 215 through which a part of the upper surface of the wiring layer 213 is exposed. A color filter layer 222 and a microlens layer 223 are provided on the protective layer 214 in the region 101. The color filter layer 222 includes a plurality of color filters, and the microlens layer 223 includes a plurality of microlenses.

In the present embodiment, the photoelectric conversion layer 220 includes an upper surface 220e, and is provided between an upper surface 225b of the member 225 and the lower surface 221a of the electrode 221 in contact with the upper surface 225b and the lower surface 221a. That is, the photoelectric conversion layer 220 is T-shaped as illustrated in FIG. 2. In this case also, the light guide is constituted by the portion 226 of the photoelectric conversion layer 220, and the height of the light guide can be expressed by, for example, (length d21)−(length d22). Here, the height corresponds to the length (the maximum length) of, for example, a member or an opening provided along a direction vertical to the surface 202 of the substrate 201. The photoelectric conversion layer 220 does not necessarily have to have the T-shape, and the upper surface 220b of the portion 226 may exist on the same plane as that of the upper surface 225b of the member 225. That is, the electrode 221 may be provided in contact with the upper surface 225b of the member 225 and the upper surface 220b of the portion 226, and the lower surface 221a of the electrode 221 may be flat. A portion between the upper surface 220b of the portion 226 of the photoelectric conversion layer 220 and the upper surface 220e may be constituted by a film made of another material.

The light guide is tapered in the present embodiment, but the shape of the light guide is not limited to the same. The first surface and the second surface are described using the areas of the lower surface and the upper surface of the light guide in the present embodiment, but the first surface and the second surface are not limited to the upper surface and the lower surface of the light guide. In the present embodiment, the transfer transistor is exemplified as the transistor of the readout circuit, and the electrode 219 of the photoelectric conversion unit 218 is connected to a source of the transfer transistor. A drain of the transfer transistor may be connected to a signal line or an amplifier circuit. However, these configurations are not restrictive. The portion to which the electrode 219 of the photoelectric conversion unit 218 is connected may, for example, be connected to a gate electrode of the amplifying transistor that constitutes a source follower circuit.

In the present embodiment, the upper surface 221b of the electrode 221 is used as the light incident surface. However, if the upper surface 221b is an unsmooth surface, a surface including an arbitrary point on the upper surface 221b and vertical to the light incident vertically on the photoelectric conversion apparatus is used as the light incident surface.

Second Embodiment

Figure 3:
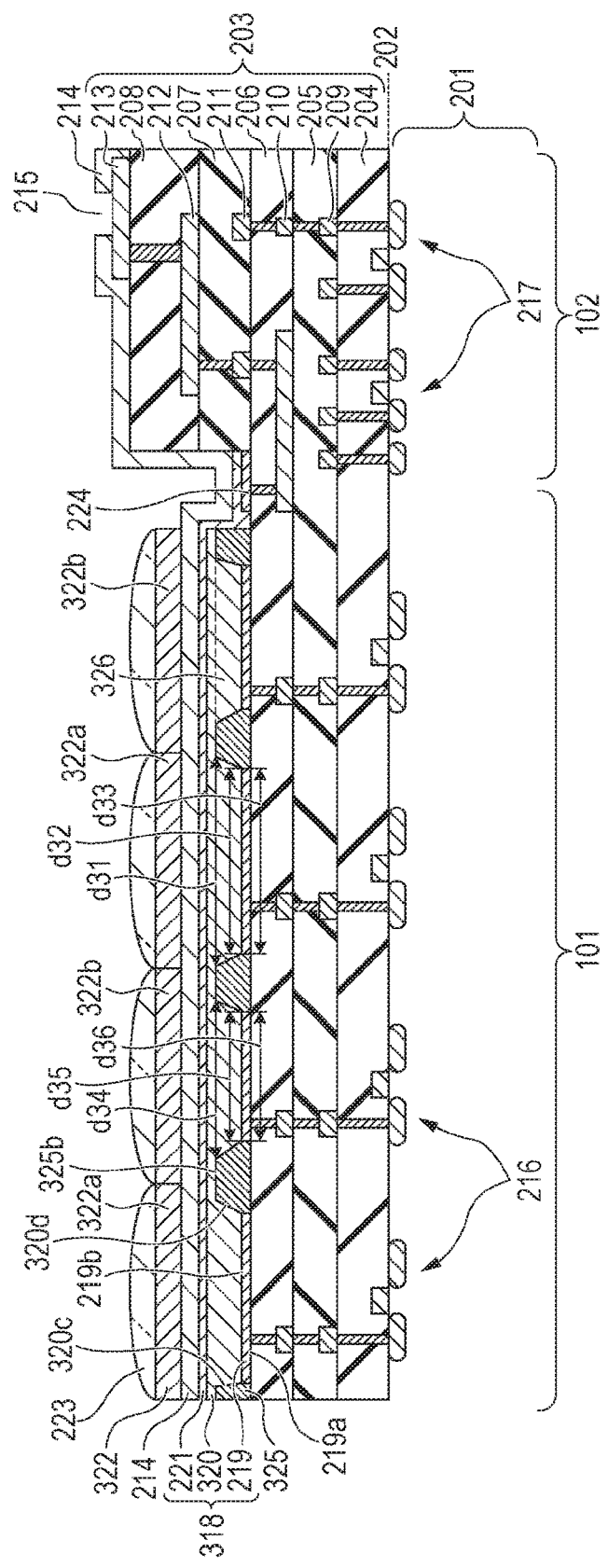
FIG. 3 is a schematic sectional view illustrating a second embodiment.

A second embodiment is described with reference to FIG. 3. The second embodiment differs from the first embodiment in the width of the light guide. In the present embodiment, the same configurations as those of the first embodiment are denoted by the same reference numerals and description thereof is omitted. In the present embodiment, configurations corresponding to those of the first embodiment are denoted by the reference numerals with the same last two digits as those in the first embodiment and detailed description thereof is omitted.

A photoelectric conversion unit 318 of the present embodiment includes an electrode 219, a photoelectric conversion layer 320 provided on the electrode 219, and an electrode 221 provided on the photoelectric conversion layer 320. The photoelectric conversion apparatus of the present embodiment includes an opening through which a part of an upper surface of the electrode 219 is exposed, and includes a member 325 that constitutes a light guide together with a portion 326 of the photoelectric conversion layer 320 provided in the opening. The width of the portion 326 of a set first surface has the length d32, the width of the portion 326 of a set second surface has the length d31, and the width of the electrode 219 is the length d33. These lengths satisfy the relationship of length d31>length d32 and length d31>length d33. Also in another portion 326, the width of a set first surface has the length d35, the width of a set second surface has the length d34, and the width of the electrode 219 is the length d36. These lengths satisfy the relationship of length d34>length d35 and length d34>length d36.

In the present embodiment, a color filter layer 322 includes a first color filter 322a corresponding to a first color, and a second color filter 322b corresponding to a second color different from the first color. Here, the first color filter 322a and the second color filter 322b have mutually different spectral transmittance profiles. In this configuration, the photoelectric conversion unit 318 corresponding to the first color filter 322a has the length d31 as the width of the opening on the upper surface 325b of the member 325. The photoelectric conversion unit 318 corresponding to the second color filter 322b has the length d34 as the width of the opening in the height of the upper surface 325b of the member 325. Here, the length d31 differs from the length d34 and is, for example, length d31>length d34.

The relationship between these widths is described. For example, if it is desirable to obtain uniform sensitivity when white light is incident on the color filter layer 322 for visible light, the following setting is made. If the amount of light passing through the first color filter 322a is smaller than the amount of light passing through the second color filter 322b, the length d31 is set to be greater than the length d34. Variation in the amount of charge produced in the photoelectric conversion layer 320 can be reduced by changing the width in accordance with the spectral characteristics of the color filter. For example, if it is desirable to reduce color mixing due to diffraction of light on the color filter layer 322 for visible light, the following setting is made. If the wavelength of light passing through the second color filter 322b is longer than the wavelength of light passing through the first color filter 322a, the length d31 is set to be longer than the length d34. Color mixing can be reduced by changing the width in accordance with the spectral characteristics of the color filter. Thus, it is possible to change the width of the opening in accordance with the characteristics of the color filter layer 322.

Here, the width of the opening is the width of the light guide, and is a distance between two side surfaces 320c and 320d of the photoelectric conversion layer 320 on a cross section vertical to the surface 202. The width of the opening seen in plan view may be made a reference. Here, the width on the surface including the upper surface 325b of the member 325 is made a reference, but the width of the portion 326 at other positions may be made a reference. In the present embodiment, the size (width) of the electrode 219 is also changed when the width of the opening is changed, but the size does not necessarily have to be changed.

Third Embodiment

Figure 4:
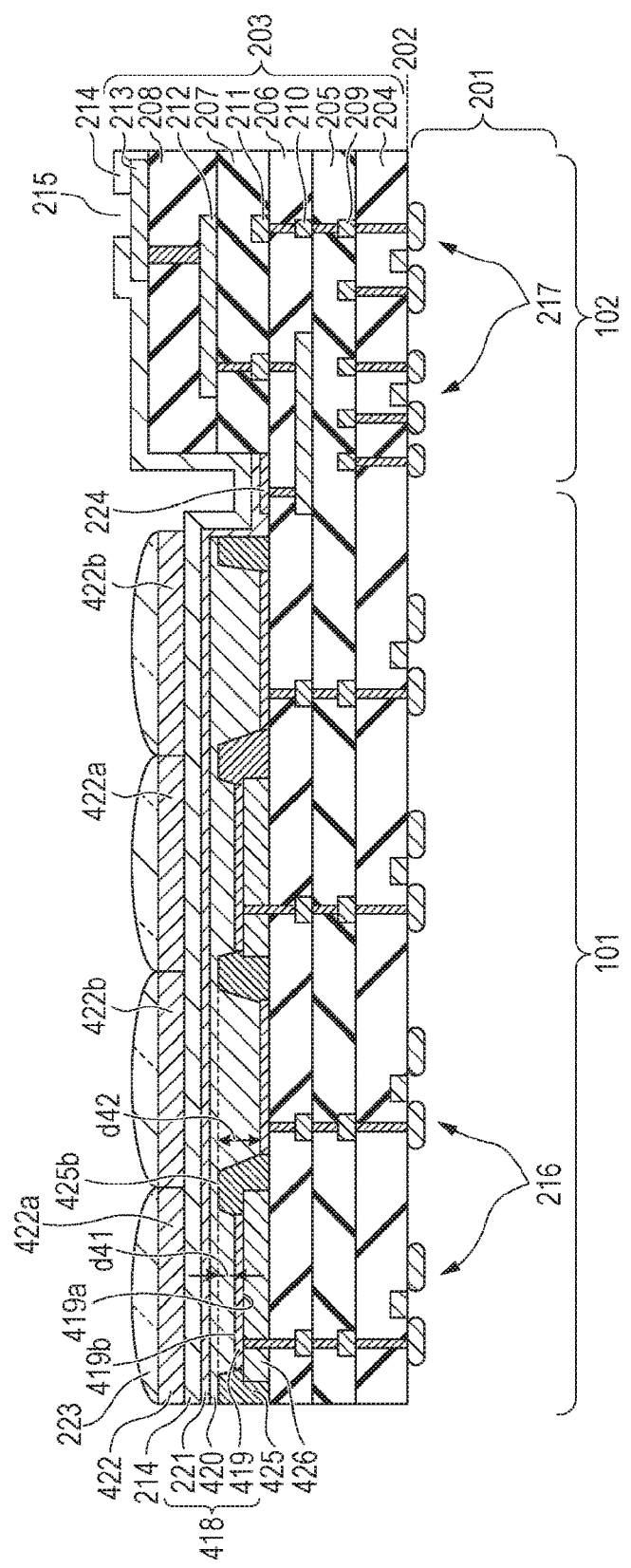
FIG. 4 is a schematic sectional view illustrating a third embodiment.

A third embodiment is described with reference to FIG. 4. The third embodiment differs from the first embodiment in the height of the light guide and differs from the second embodiment in the height, not width, of the light guide. In the present embodiment, the same configurations as those of the other embodiments are denoted by the same reference numerals and description thereof is omitted. In the present embodiment, configurations corresponding to those of the first embodiment are denoted by the reference numerals with the same last two digits as those in the first embodiment and detailed description thereof is omitted.

A photoelectric conversion unit 418 of the present embodiment includes an electrode 419, a photoelectric conversion layer 420 provided on the electrode 419, and an electrode 221 provided on the photoelectric conversion layer 420. The photoelectric conversion apparatus includes a member 425 having an opening through which a part of the upper surface of the electrode 419 is exposed. The member 425 and the photoelectric conversion layer 420 may function as a light guide as in the first embodiment. Here, a color filter layer 422 includes a first color filter 422a corresponding to a first color, and a second color filter 422b corresponding to a second color different from the first color. Here, the first color filter 422a and the second color filter 422b have mutually different spectral transmittance profiles.

In this configuration, a member 426 is provided below the electrode of the photoelectric conversion unit 418 corresponding to the first color filter 422a. The member 426 is made, for example, from the same material as that of the member 425. The photoelectric conversion layer 420 corresponding to the first color filter 422a has a thickness corresponding to the length d41 from the upper surface 419b of the electrode 419 to the height of the upper surface 425b of the member 425. The photoelectric conversion unit 418 corresponding to the second color filter 422b is not provided on the member 426. The photoelectric conversion layer 420 corresponding to the second color filter 422b has a thickness corresponding to the length d42 from the upper surface 419b of the electrode 419 to the height of the upper surface 425b of the member 425. The length d42 is longer than the length d41. Thus, it is possible to change the height of the light guide in accordance with the characteristics of the color filter layer 422.

The relationship of the height of the light guide is described. For example, it is desirable to change the depth in accordance with each color filter included in the color filter layer 422, and absorption of light in the photoelectric conversion layer 420. For example, if the second color filter 422b is provided to transmit light with a longer wavelength than light that the first color filter 422a transmits, and if the photoelectric conversion layer 420 is, for example, an amorphous silicon layer, the length d42 is desirably set to be longer than the length d41. Thus, it is possible to change the height of the light guide in accordance with the characteristics of the color filter layer 422.

In the present embodiment, the member 426 is formed, the electrode 419 is formed, and then the member 425 may be formed. The present embodiment and the second embodiment may be combined.

Fourth Embodiment

A fourth embodiment is described with reference to FIGS. 5A and 5B. The fourth embodiment differs from the other embodiments in the thickness of the photoelectric conversion layer. In the present embodiment, the same configurations as those of the other embodiments are denoted by the same reference numerals and description thereof is omitted. In the present embodiment, configurations corresponding to those of the first embodiment are denoted by the reference numerals with the same last two digits as those in the first embodiment and detailed description thereof is omitted.

Figure 5A:
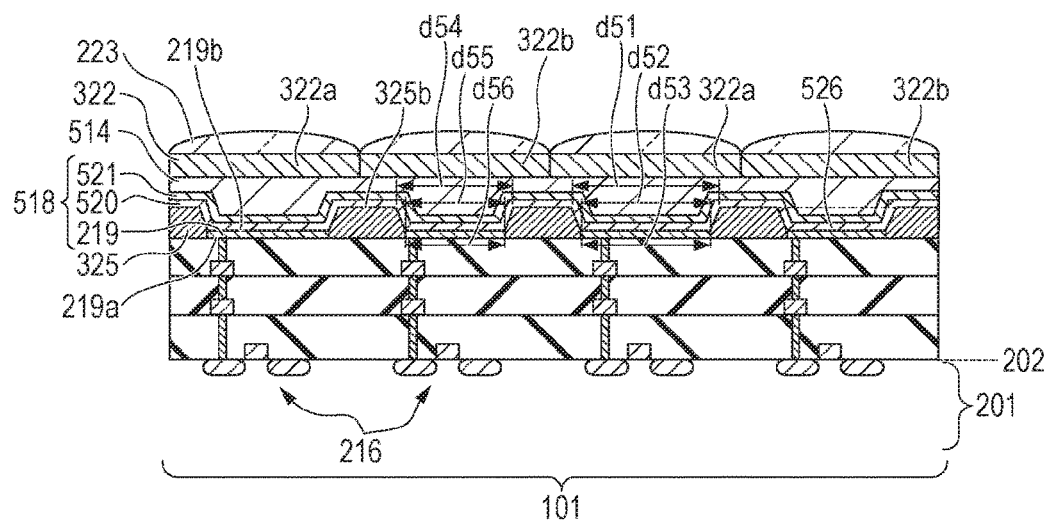
FIGS. 5A and 5B are schematic sectional views illustrating a fourth embodiment.

FIG. 5A corresponds in particular to the second embodiment, in which a width of a light guide differs in accordance with the color of a color filter of a color filter layer 322. In FIG. 5A, a photoelectric conversion unit 518 includes an electrode 219, a photoelectric conversion layer 520, and an electrode 521. Here, a photoelectric conversion layer 520 covers a side surface of an opening of a member 325 from an upper surface 325b of the member 325, and covers the electrode 219. The photoelectric conversion layer 520 is a conformal film having an upper surface conforming to the shape of the member 325. Similarly, the electrode 521 is also formed as a conformal film having an upper surface conforming to the shape of an upper surface of the photoelectric conversion layer 520. A protective layer 514 functions as a planarizing film in the region 101 filling a recess on the upper surface of the electrode 521 along the upper surface of the electrode 521.

Also in this configuration, the width of a set first surface of a portion 526 corresponding to a first color filter 322a has the length d52, the width of a set second surface of the portion 526 has the length d51, and the width of the electrode 219 is the length d53. These lengths satisfy the relationship of length d51>length d52 and length d51>length d53. Also in a portion 526 corresponding to the second color filter 322b, the width of a set first surface of the portion 526 has the length d55, and the width of a set second surface of the portion 526 has the length d54, and the width of the electrode 219 is the length d56. These lengths satisfy the relationship of length d54>length d55 and length d54>length d56.

Figure 5B:
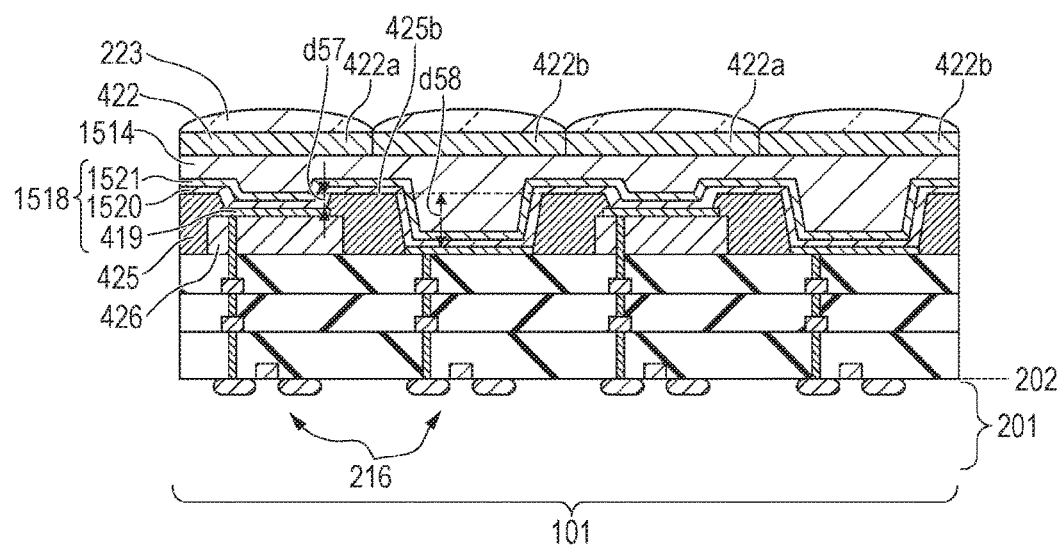

FIG. 5B corresponds in particular to the third embodiment, in which a height of a light guide differs in accordance with the color of a color filter of a color filter layer 422. A photoelectric conversion unit 1518 includes an electrode 419, a photoelectric conversion layer 1520, and an electrode 1521. Here, the photoelectric conversion layer 1520 covers a side surface of an opening of a member 425 from an upper surface 425b of the member 425, and covers the electrode 419. The photoelectric conversion layer 1520 is a conformal film having an upper surface conforming to the shape of the member 426. Similarly, the electrode 1521 is also formed as a conformal film having an upper surface conforming to the shape of an upper surface of the photoelectric conversion layer 1520. A protective layer 1514 functions as a planarizing film in the region 101 filling a recess on the upper surface of the electrode 1521 along the upper surface of the electrode 1521.

Also in this configuration, the height of the light guide corresponding to the color filter 422a has the length d57, the height of the light guide corresponding to the color filter 422b has the length d58, and the relationship in lengths is length d57<length d58.

As described above, the photoelectric conversion layer may be thin and constituted by a conformal film. Since the photoelectric conversion layer is thinner than the photoelectric conversion layers of the second and the third embodiments, the shapes of the openings of the member 325 and the member 425 are desirably round, elliptical, or rectangular with rounded corners when seen in plan view.

Fifth Embodiment

A fifth embodiment is described with reference to FIG. 6. In the present embodiment, the same configurations as those of the other embodiments are denoted by the same reference numerals and description thereof is omitted. In the present embodiment, configurations corresponding to those of the first embodiment are denoted by the reference numerals with the same last two digits as those in the first embodiment and detailed description thereof is omitted.

Figure 6:
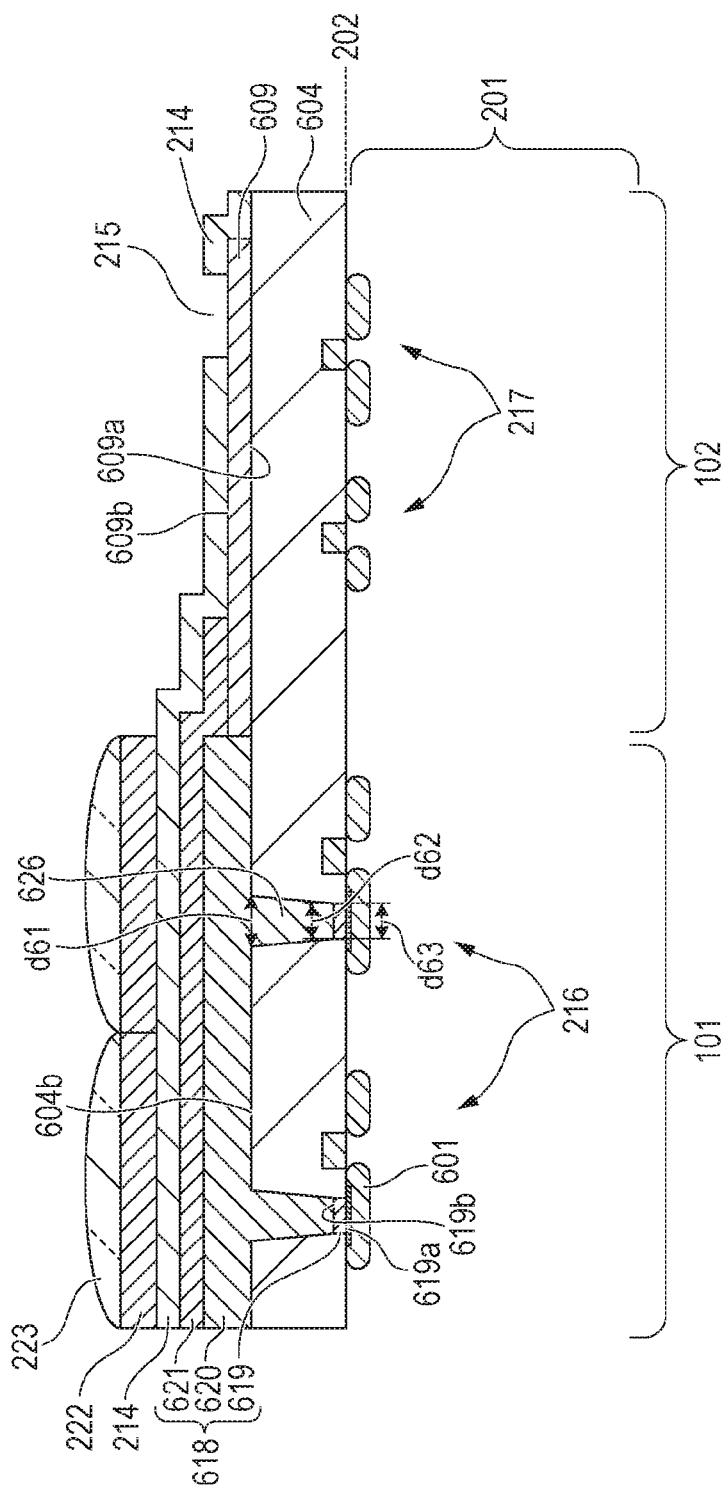
FIG. 6 is a schematic sectional view illustrating a fifth embodiment.

In FIG. 6, a photoelectric conversion unit 618 includes an electrode 619, a photoelectric conversion layer 620 provided on the electrode 619, an electrode 621 provided on the photoelectric conversion layer 620, and a member 604. Here, a lower surface 619a of the electrode 619 is provided in direct contact with a surface 202 of a substrate 201, and is electrically connected to a semiconductor region 601. The member 604 is provided on the surface 202 to extend over a region 101 and a region 102. The photoelectric conversion layer 620 fills an opening provided in the member 604, is electrically connected to the electrode 619, and covers the member 604 in the region 101 other than the opening. The electrode 621 covers the photoelectric conversion layer 620, and is electrically connected to a wiring layer 609 provided in the region 102. A protective layer 214 is provided to extend from the region 101 to the region 102 over the electrode 621 and the wiring layer 609. The protective layer 214 has an opening 215 through which a part of an upper surface 609b of the wiring layer 609 is exposed, and the wiring layer 609 functions as a terminal. Here, the member 604 and the photoelectric conversion layer 620 constitute a light guide as in the first embodiment.

Also in this configuration, when seen in cross sectional view, an upper surface 620b of the portion 626 has the width of the length d61, a certain surface between the upper surface 620b and the electrode 619 has the width of the length d62, and the length of the lower surface 619a having the maximum width of the electrode 619 has the length d63. Relationships between these lengths are length d61>length d62 and length d61>length d63. That is, in the portion 626, an area of a set first surface parallel to the light incident surface is smaller than an area of a set second surface parallel to the light incident surface and located between the first surface and the electrode 621. An area of orthogonal projection to the light incident surface of the electrode 619 is smaller than an area of orthogonal projection to the light incident surface of the second surface.

Hereinafter, as an application of the photoelectric conversion apparatus according to each of the embodiments, an image pickup system is described in which the photoelectric conversion apparatus is incorporated. The concept of the image pickup system includes not only apparatuses mainly made for photographing, such as a camera, but apparatuses provided with a photographing function as an auxiliary function (e.g., a personal computer and a portable terminal). The image pickup system includes the photoelectric conversion apparatus according to the present invention as illustrated in each embodiment above, and a signal processing unit that processes signals output from the photoelectric conversion apparatus. The signal processing unit may include, for example, an A/D converter, and a processor that processes digital data output from the A/D converter.

Each embodiment is illustrative only and not restrictive. For example, the semiconductor substrate is exemplified as the substrate in each embodiment, but the substrate may be other substrates, such as a glass substrate and a flexible board, on which a circuit is formed. A functional layer, such as a charge blocking layer, for suppressing charge entering the photoelectric conversion layer from the electrode may be provided between at least one electrode and the photoelectric conversion layer. Alternatively, an insulating layer may be provided between at least one electrode and the photoelectric conversion layer (this configuration is referred to as an MIS structure). The photoelectric conversion layer extends over the upper surface of the member in the embodiments. But the photoelectric conversion layer may extend only inside the opening, i.e., the photoelectric conversion layer may have an upper surface flush with the upper surface of the member. A single or a plurality of insulating layers or protective layers may be provided. If a plurality of insulating layers or protective layers are provided, these layers may include different materials. Each embodiment may be changed or combined suitably. Each embodiment may be manufactured by publicly known semiconductor manufacturing technology.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
a substrate;
a first electrode disposed on the substrate;
a plurality of pixel electrodes each disposed between the first electrode and a surface of the substrate, including a first pixel electrode, a second pixel electrode, and a third pixel electrode;
a photoelectric conversion layer disposed between the first electrode and the plurality of pixel electrodes; and
a member including a first portion disposed between the first pixel electrode and the second pixel electrode in a plan view, and a second portion disposed between the second pixel electrode and the third pixel electrode in the plan view, wherein
in a cross section, vertical to the surface of the substrate, of the photoelectric conversion layer, a first distance between the first portion of the member and the second portion of the member at a first level is larger than a second distance between the first portion of the member and the second portion of the member at a second level which is closer to the substrate than the first level is, and in the cross section, a width of the second pixel electrode is smaller than a maximum distance between the first portion of the member and the second portion of the member.

2. The photoelectric conversion apparatus according to claim 1, wherein in the cross section, the width of the second pixel electrode is larger than the second distance.

3. The photoelectric conversion apparatus according to claim 2, wherein
in the cross section, the first level is a height of a surface of the first portion of the member, the surface being an opposite surface to the substrate.

4. The photoelectric conversion apparatus according to claim 3, wherein
in the cross section, the second level is a height of a second surface of the first portion of the member, the second surface being an opposite surface to the surface of the first portion.

5. The photoelectric conversion apparatus according to claim 3, further comprising:
a color filter disposed between the plurality of lenses and the first electrode.

6. The photoelectric conversion apparatus according to claim 1, further comprising:
a plurality of lenses including a first lens disposed on the first pixel electrode and a second lens disposed on the second pixel electrode.

7. The photoelectric conversion apparatus according to claim 6, wherein
in the cross section, a width of the first lens is larger than a width of the first pixel electrode.

8. The photoelectric conversion apparatus according to claim 7, wherein
the first lens and the second lens are in contact with each other.

9. The photoelectric conversion apparatus according to claim 1, wherein
each of the first portion of the member and the second portion of the member is tapered.

10. The photoelectric conversion apparatus according to claim 1, wherein
the plurality of the pixel electrodes includes a fourth pixel electrode,
the member includes a third portion disposed between the third pixel electrode and the fourth pixel electrode in the plan view, and
in the cross section, a third distance between the second portion of the member and the third portion of the member at the first level is larger than a fourth distance between the second portion of the member and the third portion of the member at the second level.

11. The photoelectric conversion apparatus according to claim 1, wherein the photoelectric conversion layer is a quantum dot layer.

12. The photoelectric conversion apparatus according to claim 1, further comprising:
an insulating layer between the plurality of pixel electrodes and the photoelectric conversion layer.

13. The photoelectric conversion apparatus according to claim 1, wherein the photoelectric conversion layer and the member constitute a light guide.

14. The photoelectric conversion apparatus according to claim 1, further comprising:
a plurality of transistors provided in the substrate and respectively connected to the plurality of pixel electrodes.

15. The photoelectric conversion apparatus according to claim 1, further comprising:
a pad electrode, wherein
the substrate includes a pixel region and a peripheral region, and
the first electrode extends over the pixel region and is connected to the pad electrode provided on the peripheral region.

16. The photoelectric conversion apparatus according to claim 15, further comprising:
a wiring layer disposed between the plurality of pixel electrodes and the substrate; and
a plurality of transistors provided in the substrate and respectively connected to the plurality of pixel electrodes via the wiring layer, wherein
the wiring layer connects the first electrode and the pad electrode.

17. The photoelectric conversion apparatus according to claim 16, further comprising:
a plurality of lenses including a first lens disposed on the first pixel electrode and a second lens disposed on the second pixel electrode.

18. The photoelectric conversion apparatus according to claim 17, wherein
in the cross section, a width of the first lens is larger than a width of the first pixel electrode.

19. An image pickup system, comprising:
the photoelectric conversion apparatus according to claim 1; and
a signal processing unit configured to process signals from the photoelectric conversion apparatus.

20. The photoelectric conversion apparatus according to claim 1, wherein
each of the first portion of the member and the second portion of the member does not overlap with the second pixel electrode.

21. The photoelectric conversion apparatus according to claim 1, wherein
the first pixel electrode and the second pixel electrode are arranged at different levels from each other.

22. The photoelectric conversion apparatus according to claim 1, wherein
the photoelectric conversion layer continuously extends from a first portion overlapping the first pixel electrode to a second portion overlapping the second pixel electrode in the plan view.

23. The photoelectric conversion apparatus according to claim 22, wherein
in the cross section, a surface of the second region of the photoelectric conversion layer, the surface being an opposite surface to the substrate, is disposed in higher portion than a surface of the first portion of the member, the surface being an opposite surface to the substrate.

24. The photoelectric conversion apparatus according to claim 22, wherein
in the cross section of the photoelectric conversion layer, a surface of the second portion of the photoelectric conversion layer, the surface being an opposite surface to the substrate, and a surface of a portion which is disposed between the first portion of the member and the second portion of the member, the surface being an opposite surface to the substrate, are disposed at a same height.

25. The photoelectric conversion apparatus according to claim 1, wherein the first distance is equal to the maximum distance.

26. A photoelectric conversion apparatus comprising:
a substrate;
a first electrode disposed on the substrate;
a plurality of pixel electrodes each disposed between the first electrode and the substrate, including a first pixel electrode and a second pixel electrode;
a photoelectric conversion layer disposed between the first electrode and the plurality of pixel electrodes, and continuously extending from a position between the first electrode and the first pixel electrode to a position between the first electrode and the second pixel electrode; and
a member that is in contact with the photoelectric conversion layer, wherein
in a cross section of the photoelectric conversion layer, a portion of the photoelectric conversion layer which is disposed on the first pixel electrode is arranged between a first portion of the member and a second portion of the member,
in the cross section, a first distance between the first portion and the second portion of the member at a first level is larger than a second distance between the first portion and the second portion of the member at a second level which is closer to the substrate than the first level is,
the second portion of the member is disposed between the first pixel electrode and the second pixel electrode and/or on a region between the first pixel electrode and the second pixel electrode, and
in the cross section, a width of the first pixel electrode is smaller than the first distance.

27. The photoelectric conversion apparatus according to claim 26, wherein
in the cross section, the width of the first pixel electrode is larger than the second distance.

28. The photoelectric conversion apparatus according to claim 27, further comprising:
a plurality of lenses including a first lens disposed on the first pixel electrode and a second lens disposed on the second pixel electrode.

29. The photoelectric conversion apparatus according to claim 28, wherein
the first lens and the second lens are in contact with each other.

30. The photoelectric conversion apparatus according to claim 26, wherein
the member includes a third portion,
in the cross section, a different portion of the photoelectric conversion layer which is disposed on the second pixel electrode is arranged between the second portion of the member and the third portion of the member, and
in the cross section, a third distance between the second portion and the third portion of the member at the first level is larger than a fourth distance between the second portion and the third portion of the member at the second level.

31. The photoelectric conversion apparatus according to claim 26, wherein the photoelectric conversion layer is a quantum dot layer.

32. The photoelectric conversion apparatus according to claim 26, further comprising:
an insulating layer between the plurality of pixel electrodes and the photoelectric conversion layer.

33. An image pickup system, comprising:
the photoelectric conversion apparatus according to claim 26; and
a signal processing unit configured to process signals from the photoelectric conversion apparatus.

* * * * *